(12) United States Patent
Kim et al.

(10) Patent No.: US 6,930,050 B2
(45) Date of Patent: Aug. 16, 2005

(54) MULTI-CHAMBER SYSTEM HAVING COMPACT INSTALLATION SET-UP FOR AN ETCHING FACILITY FOR SEMICONDUCTOR DEVICE MANUFACTURING

(75) Inventors: Ki-sang Kim, Kyungki-do (KR); Gyu-chan Jeoung, Kyungki-do (KR); Gyu-hwan Kwag, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 108 days.

(21) Appl. No.: 10/298,605

(22) Filed: Nov. 19, 2002

(65) Prior Publication Data

US 2003/0073323 A1 Apr. 17, 2003

Related U.S. Application Data

(62) Division of application No. 09/237,229, filed on Jan. 26, 1999, now Pat. No. 6,503,365.

(30) Foreign Application Priority Data

Apr. 21, 1998 (KR) .............................. 98-14228

(51) Int. Cl.$^7$ ...................... C23C 16/00; H01H 21/302; H01L 21/461; B65H 1/00; B65G 49/07
(52) U.S. Cl. .................... 438/716; 438/689; 118/719; 414/217; 414/222.01; 414/222.07; 414/222.12; 414/935; 414/937; 414/939; 414/941; 414/800; 414/804; 414/805; 414/806; 414/807; 414/808; 414/810; 414/814; 156/345.31; 156/345.32
(58) Field of Search ................ 118/719; 414/217, 414/222.01, 222.07, 222.12, 223.01, 935, 937, 939, 941, 800, 804–808, 810, 814; 438/689, 716; 216/58, 63; 156/345.31, 345.32

(56) References Cited

U.S. PATENT DOCUMENTS

| | | | |
|---|---|---|---|
| 4,951,601 A | 8/1990 | Maydan et al. | 118/719 |
| 5,259,881 A | 11/1993 | Edwards et al. | 118/719 |
| 5,273,244 A | 12/1993 | Ono | 248/176 |
| 5,286,296 A | 2/1994 | Sato et al. | 118/719 |
| 5,292,393 A | 3/1994 | Maydan et al. | 156/345 |
| 5,306,380 A | 4/1994 | Hiroki | 156/345 |
| 5,445,491 A * | 8/1995 | Nakagawa et al. | 414/805 |
| 5,527,390 A | 6/1996 | Ono et al. | 118/719 |
| 5,577,879 A | 11/1996 | Eastman et al. | 414/744.5 |
| 5,685,684 A * | 11/1997 | Kato et al. | 414/217 |
| 5,695,564 A | 12/1997 | Imahashi | 118/719 |
| 5,700,127 A * | 12/1997 | Harada et al. | 414/416.08 |
| 5,765,983 A | 6/1998 | Caveney et al. | 414/217 |
| 5,788,447 A | 8/1998 | Yonemitsu et al. | 414/217 |
| 5,788,868 A * | 8/1998 | Itaba et al. | 216/41 |
| 5,820,679 A | 10/1998 | Yokoyama et al. | 118/719 |
| 6,053,980 A | 4/2000 | Suda et al. | 118/719 |
| 6,099,598 A * | 8/2000 | Yokoyama et al. | 29/25.01 |
| 6,174,377 B1 | 1/2001 | Doering et al. | 118/729 |
| 6,188,935 B1 | 2/2001 | Soraoka et al. | 700/229 |
| 6,299,722 B1 * | 10/2001 | Toda | 156/345.25 |
| 6,301,802 B1 | 10/2001 | Kato et al. | 34/406 |
| 6,315,512 B1 | 11/2001 | Tabrizi et al. | 414/217 |
| 6,340,405 B2 | 1/2002 | Park | 156/345 |
| 6,503,365 B1 * | 1/2003 | Kim et al. | 156/345.32 |
| 6,655,891 B2 * | 12/2003 | Ueda et al. | 414/217 |
| 6,722,834 B1 * | 4/2004 | Tepman | 414/217 |
| 2003/0017034 A1 * | 1/2003 | Davis et al. | 414/404 |
| 2003/0073323 A1 * | 4/2003 | Kim et al. | 438/710 |

FOREIGN PATENT DOCUMENTS

| | | |
|---|---|---|
| JP | 7-211763 | 8/1995 |
| KR | 1999-0025706 | 7/1999 |

* cited by examiner

*Primary Examiner*—Jeffrie R. Lund
(74) *Attorney, Agent, or Firm*—Volentine Francos & Whitt, pllc

(57) ABSTRACT

A multi-chamber system of an etching facility for manufacturing semiconductor devices occupies a minimum amount of floor space in a cleanroom by installing a plurality of processing chambers in multi-layers and in parallel along a transfer path situated between the processing chambers. The multi-layers number 2 to 5, and the transfer path can be rectangular in shape and need only be slightly wider than the diameter of a wafer. The total width of the multi-chamber system is the sum of the width of one processing chamber plus the width of the transfer path.

44 Claims, 7 Drawing Sheets ial application of application Ser. No. 09/237,229, filed Jan. 26, 1999, now U.S. Pat. No. 6,503, 365. This application claims priority under 35 U.S.C. §119 to Korean Patent Application No. 1998-14228 filed on Apr. 21, 1998.

BACKGROUND OF THE INVENTION

1. Field of the Invention

The present invention relates to a multi-chamber system of an etching facility for manufacturing semiconductor devices, and more particularly, to a multi-chamber system of an etching facility for manufacturing semiconductor devices which minimizes the space occupied by the facility by aligning a plurality of processing chambers with a transfer path in the center.

2. Background of the Related Art

The manufacturing of semiconductor devices involves many processes, including photolithography, etching, and thin film formation, which are repeatedly carried out during the manufacturing process. Generally, the etching process is carried out in a "focus-type" multi-chamber system which is capable of processing various process steps for wafers at the same time.

In particular, the multi-chamber system for a dry-etching process using plasma is operated with a plurality of processing chambers in which a high-vacuum state environment for the generation of plasma is formed. The system includes an inner transfer device for transporting wafers from a central chamber under a low vacuum state to the plurality of high vacuum processing chambers.

FIG. 1 illustrates a conventional focus-type multi-chamber system for a dry-etching process using plasma, which is constructed in such a manner that a hexagonal pillar-shaped central chamber 16 is located in its center; four processing chambers 15 are connected to four sides of the central chamber 16, and between the central chamber 16 and each of the processing chambers 15, there is formed a gate (not shown) for allowing the selective passage of wafers. An inner transfer device 14 inside the central chamber 16 is able to selectively load and unload the wafers into each processing chamber 15 through the gate. Note that the central chamber 16 can be formed as a square, pentagon, hexagon shape, etc., and FIG. 1 shows the normal hexagonal shape of the central chamber 16. Further, there is provided a vacuum pressure generator (not shown) in each of the processing chambers 15 and the central chamber 16.

Therefore, the inner transfer device 14 transports wafers to the processing chamber 15 under the vacuum pressure environment. In addition to the central chamber 16, a load lock chamber 13, serving as a stand-by area for the wafers under a low vacuum state, is located between the central chamber 16 and the wafers which are under atmospheric pressure in cassettes 11.

The load lock chamber 13 comprises an input load lock chamber for stacking wafers before processing, and an output load lock chamber for stacking wafers after processing.

In addition to the two load lock chambers 13, there is connected a cassette stage 12 having the cassettes 11 mounted thereon for easy transportation of wafers under atmospheric pressure.

Therefore, in the conventional multi-chamber system, if the cassette 11 is mounted on the cassette stage 12, an operator or the automatic transfer mechanism, etc., inside the load lock chamber 13 transfers the cassette 11 having wafers thereon to the load lock chamber 13, and then, the load lock chamber 13 is sealed and placed under a low vacuum state. When the load lock chamber 13 reaches a certain level of vacuum, the gate of the load lock chamber 13 is opened, an inner transfer device 14 inside the central chamber 16 mounts wafers individually or in groups on a transfer arm (not shown) under a low vacuum state, and transfers them to a specific processing chamber 15 by rotating horizontally a certain angle, and proceeding toward the specific processing chamber 15.

In addition, after wafers are transported into the processing chamber 15, the gate of the processing chamber 15 is shut, and a specific corresponding process is carried out. The processed wafers are removed from the processing chamber by the inner transfer device 14 of the central chamber 16, and stacked on the cassette 11 inside the load lock chamber 13.

Here, while a specific process is carried out inside a specific processing chamber 15, the inner transfer device 14 is capable of continuously loading and unloading wafers to another processing chamber 15. Therefore, a plurality of wafers can be processed inside a plurality of processing chambers 15 at the same time.

However, the conventional multi-chamber system, which is constructed as described above, i.e., the hexagonal pillar shaped central chamber 16, four processing chambers 15 and two load lock chambers 13 surrounding the central chamber 16, occupies a space of width "W" inside the fabrication line layout, requiring a large vacuum facility to maintain the central chamber 16 in a vacuum state and increasing the expenses for the facilities and their installation.

In addition, the space taken up by the central chamber increases with the number of processing chambers. For instance, six processing chambers and two load lock chambers require an octagonal pillar shaped central chamber which takes up more space than the hexagonal pillar-shaped central chamber shown in FIG. 1.

Therefore, if the number of processing chambers is increased, a different multi-chamber system is necessary, occupying additional cleanroom space and requiring additional expense. Various process gases and vacuum-related apparatus connected to the processing chamber or the load lock chamber must also be installed in duplicate.

An attempt to increase the number of processing chambers of the focus-type multi-chamber system, as shown in FIG. 2, comprises two central chambers 16, each connected to three processing chambers 15. The two central chambers 16 are connected to each other by a connection load lock chamber 17 between them. Two of the conventional focus-type multi-chamber systems 10 are thereby connected.

However, the installation of the six processing chambers 15 and one connection load lock chamber 17 as shown in FIG. 2 costs more than the installation of an additional focus-type multi-chamber system 10 as shown in FIG. 1, and the seven-chamber set-up still occupies a lot of space in the cleanroom, and requires duplicate installation of various processing gases and vacuum-related apparatus.

Furthermore, as shown in FIG. 3, the conventional focus-type multi-chamber system 10 is normally installed inside the cleanroom along with other facilities 20, with the cassette stages on the other facilities all being disposed to one side. Therefore, it is necessary for an operator or an automatic cassette car to transport cassettes between facilities.

In addition to the disadvantages of the focus-type multi-chamber system, the inner transfer device moves wafers under a vacuum state, and therefore, the wafers cannot be attached by vacuum-absorption, and are simply gravity-supported by the transfer arm. The wafers must therefore be moved at a low speed so as not to be displaced from the transfer arm, which results in a very slow wafer transfer operation.

SUMMARY OF THE INVENTION

The present invention is directed to a multi-chamber system of an etching facility for manufacturing semiconductor devices for greatly reducing the space and the width occupied by the facilities by aligning a plurality of processing chambers in multi-layers and in parallel, which substantially overcomes one or more of the problems due to the limitations and the disadvantages of the related art.

To achieve these and other advantages and in accordance with the purpose of the present invention, the multi-chamber system for manufacturing semiconductor devices comprises: a cassette stage for mounting a cassette having wafers stacked thereon; a transfer path adjacent to the cassette stage and having a width slightly larger than the diameter of the wafers, preferably with a rectangular-shape, for providing a space for the transportation of wafers; a plurality of processing chambers aligned with the transfer path; and a transfer mechanism installed in the transfer path for loading and unloading the wafers stacked on the cassette stage to the plurality of processing chambers.

In addition, the processing chambers are disposed in multiple layers, and a load lock chamber may be connected to one side of the processing chamber to serve as a stand-by area for the wafers.

The load lock chamber may comprise: a transfer arm for receiving the wafers from the transfer mechanism and transferring the wafers to the processing chamber; an inner transfer device for moving the transfer arm; and gates formed on the side of the transfer path and the side of the processing chamber, respectively, the gates being selectively opened and closed to allow passage of the wafers.

Preferably, the transfer mechanism comprises: a transfer arm for selectively holding the wafers; a transfer robot for loading and unloading the wafers into the processing chamber by moving the transfer arm; a horizontal driving part for moving the transfer robot horizontally; and a controller for controlling the transfer robot and the horizontal driving part by applying control signals thereto.

The transfer mechanism may further comprise a vertical driving part for moving the transfer robot vertically on receipt of a control signal from the controller. In addition, a vacuum line is preferably installed on the transfer arm so as to vacuum-absorb wafers. In addition, the transfer path may be extended and a plurality of transfer mechanisms installed such that wafers can be transferred from one transfer mechanism to another.

Prior to processing, the wafers are stacked on a cassette mounted on a first cassette stage. The wafers are then transferred to the processing chambers; and the processed wafers are transferred to a second cassette stage which is located such that the wafers are easily transferred to a subsequent process.

In another aspect of the present invention, a multi-chamber system for manufacturing semiconductor devices comprises: a cassette stage for mounting a cassette having wafers stacked thereon; a rectangular-shaped transfer path adjacent to the cassette stage for providing space for transportation of wafers; a plurality of processing chambers aligned in multi-layers parallel to and beside the transfer path; and a transfer mechanism capable of vertical/horizontal reciprocal movement installed in the transfer path for loading and unloading the wafers stacked on the cassette stage to the plurality of processing chambers.

The transfer mechanism comprises: a transfer arm having a vacuum line installed thereto so as to selectively vacuum-absorb wafers; a transfer robot for loading and unloading the wafers into the processing chamber by moving the transfer arm; a vertical driving part for moving the transfer robot vertically; a horizontal driving part for moving the transfer robot horizontally; and a controller for controlling the transfer robot, the vertical driving part, and the horizontal driving part by applying control signals thereto.

In another aspect of the present invention, a multi-chamber system for manufacturing semiconductor devices comprises: a first cassette stage for mounting a cassette having unprocessed wafers stacked thereon; a transfer path with a rectangular shape adjacent to the cassette stage for providing space for the transportation of wafers; a plurality of processing chambers arranged in multi-layers and aligned in parallel beside the transfer path; a transfer mechanism capable of vertical/horizontal reciprocal movement installed in the transfer path for loading and unloading the wafers stacked on the first cassette stage to the plurality of the processing chambers; and a second cassette stage placed opposite to the first cassette stage and mounting a cassette having processed wafers stacked thereon.

The transfer mechanism comprises: a transfer arm having a vacuum line for selectively vacuum-absorbing wafers; a transfer robot for loading and unloading wafers to the processing chamber by moving the transfer arm; a vertical driving part for vertically moving the transfer robot; a horizontal driving part for horizontally moving the transfer robot; and a controller for controlling the transfer robot, the vertical driving part, and the horizontal driving part by applying control signals thereto.

It is to be understood that both the foregoing general description and the following detailed description are exemplary and explanatory and are intended to provide a further explanation of the invention as claimed.

BRIEF DESCRIPTION OF THE ATTACHED DRAWINGS

The accompanying drawings, which are included to provide a further understanding of the invention and are incorporated in and constitute a part of this specification illustrate embodiments of the invention, wherein like reference numerals refer to like elements throughout, in which.

DETAILED DESCRIPTION OF PREFERRED EMBODIMENT

Reference will now be made in detail to preferred embodiments of the present invention, examples of which are illustrated in the accompanying drawings.

Figure 4:
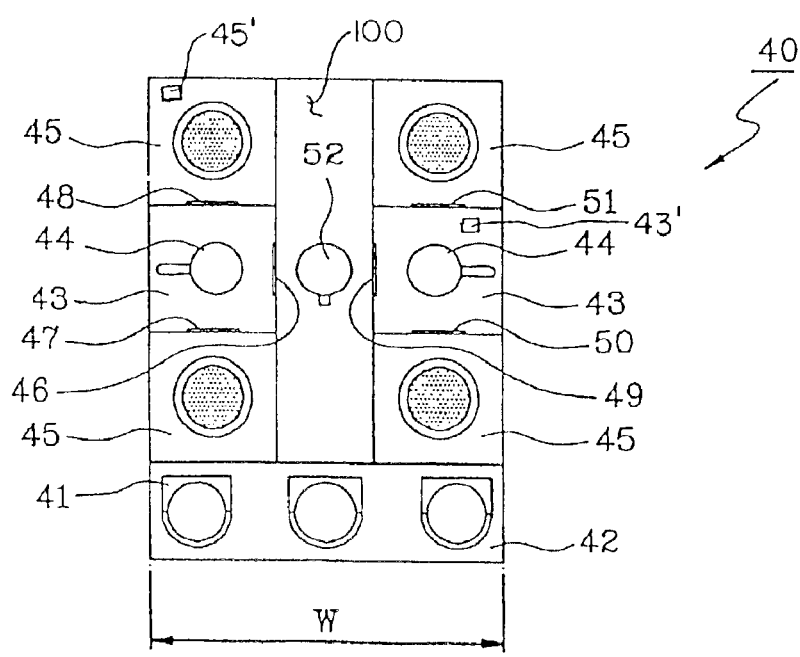
FIG. 4 is a plan view of a multi-chamber system of an etching facility for manufacturing semiconductor devices according to one embodiment of the present invention.

FIG. 4 is a plan view showing a multi-chamber system of an etching facility for manufacturing semiconductor devices according to one preferred embodiment of the present invention. Referring to FIG. 4, the multi-chamber system is constructed in such a manner that a cassette 41 having wafers stacked thereon is mounted on a cassette stage 42, and eight processing chambers 45 for carrying out processes are displaced in parallel with multi-layers on both sides of a transfer path 100, four of which are shown in the plan view of FIG. 4. The transfer path 100 has a shape having a narrow width, preferably a rectangular shape, and a transfer mechanism 52 is provided in the transfer path 100 in order to load and unload the wafers stacked on the cassette stage 42 into each of the eight processing chambers 45.

The cassette stage 42 includes a cassette elevator for moving the cassette up and down and can be moved horizontally so as to switch the locations of cassettes.

Figure 1:
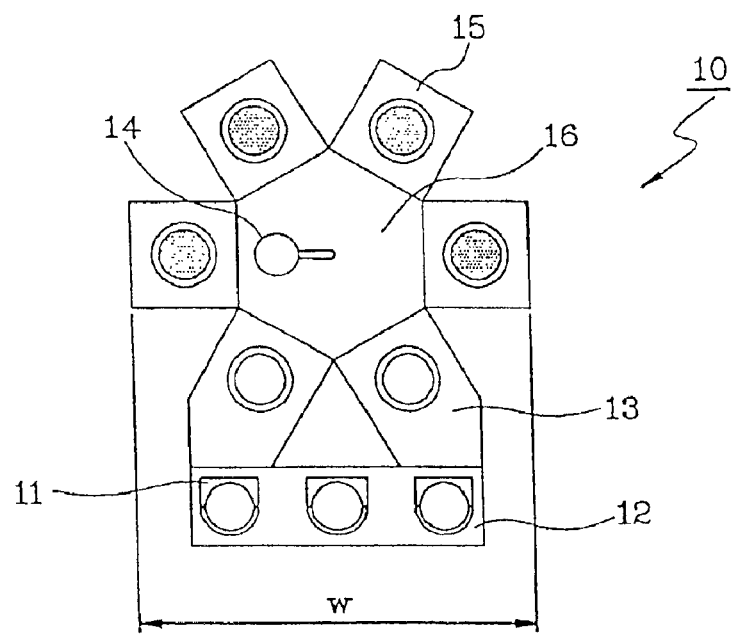
FIG. 1 is a plan view of a conventional multi-chamber system of an etching facility for manufacturing semiconductor devices.
Figure 2:
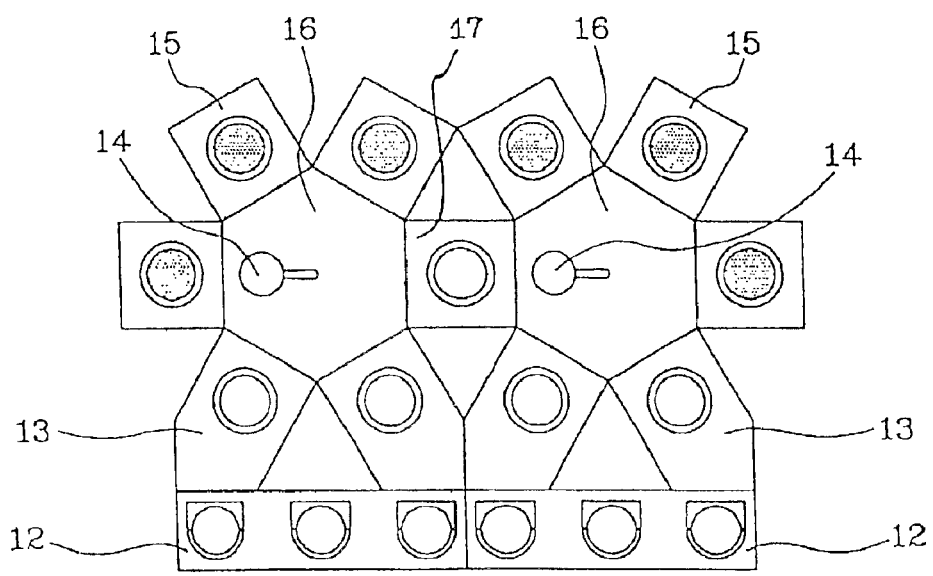
FIG. 2 is a plan view of two of the multi-chamber systems of FIG. 1 connected to each other.
Figure 3:
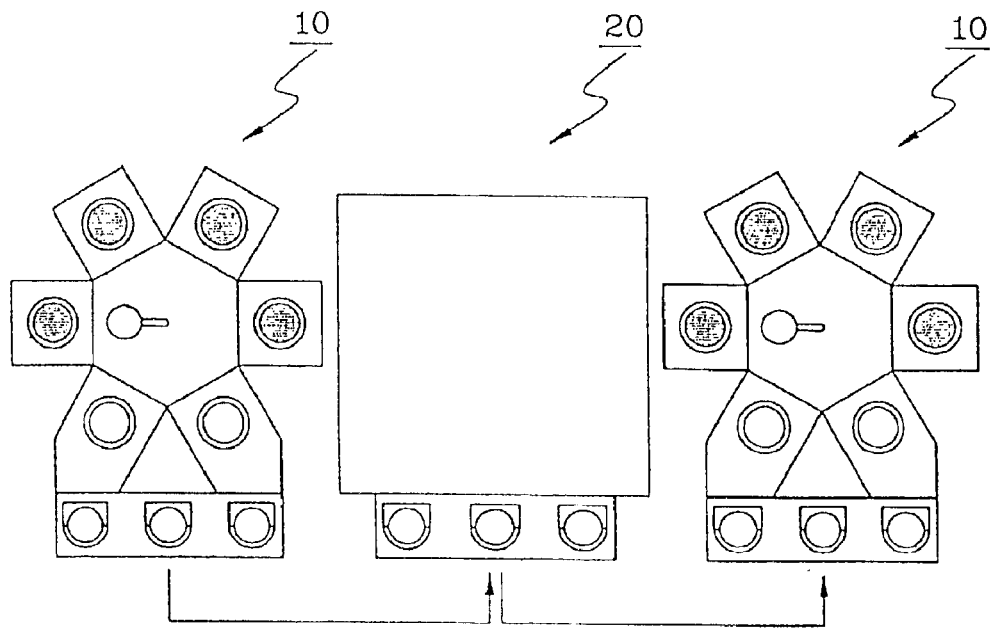
FIG. 3 is a plan view of two of the multi-chamber systems of FIG. 1 installed inside a semiconductor device fabrication line.
Figure 5:
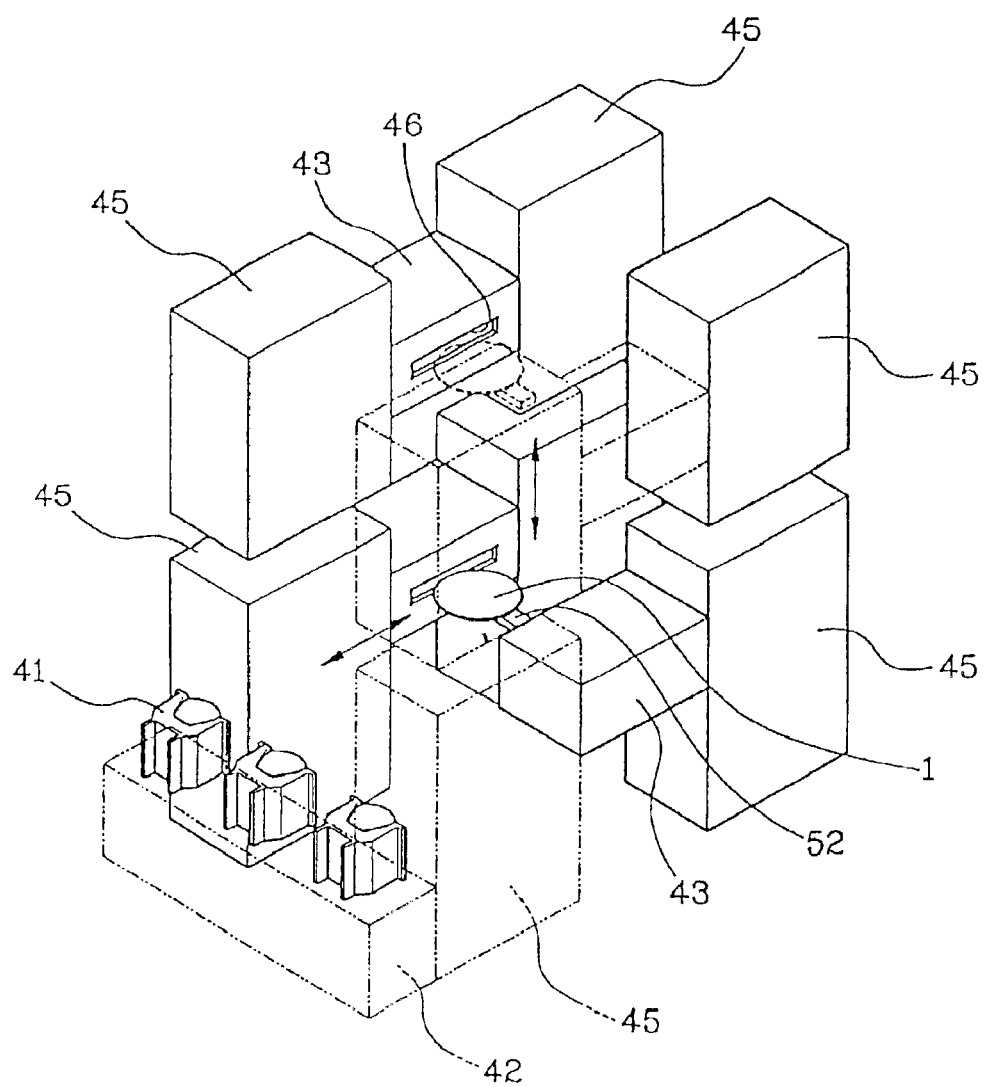
FIG. 5 is a perspective view of the multi-chamber system of FIG. 4.

The processing chambers 45 can be aligned in a single layer, but considering the efficiency of the space, a two-layer arrangement may be used as shown in FIG. 5, each layer having four processing chambers 45 aligned in parallel. With this arrangement, each layer comprises four processing chambers 45, two load lock chambers 43 which are the same size as those in the conventional multi-chamber system 10 of FIG. 1, and one transfer path 100. Therefore, the facility width "W" of the multi-chamber system 40 of the present invention is the sum of the widths of those of the two processing chambers 45 and the one transfer path 100. This width "W" is minimized, because the width of the hexagonal pillar-shaped central chamber in the conventional system is replaced by that of the transfer path 100 in the multi-chamber system, and the transfer path 100 is only a little wider than the diameter of one wafer.

In addition, the depth of the multi-chamber system is minimized, because the depth of the hexagonal pillar-shaped central chamber, each side of which is slightly larger than the diameter of a wafer, is replaced by that of the load lock chamber 43. The shape of the load lock chamber 43 can be optimized as a regular rectangular pillar shape so as to be only slightly deeper than the diameter of one wafer, thereby decreasing the width and depth of the whole facility.

Therefore, the area occupied by a single-layer structure (not shown) of the multi-chamber system according to the present invention is less than the area occupied by the conventional system; and the multi-layer structure as shown in FIGS. 4 and 5 is even more compact. Furthermore, the multi-layer structure preferably has 2 to 5 layers.

In addition, the space occupied by the load lock chamber 43 can be minimized, and the volume of the vacuum facility or supplementary apparatus can be reduced, thereby minimizing expenses for the facility and its installation.

In addition, as described below, the transfer mechanism 52 allows wafers to be moved quickly by holding them using vacuum pressure so that it is not necessary to install a supplementary vacuum pressure generator.

A vacuum is not formed in the transfer path 100, unlike the case of the conventional central chamber, thereby allowing use of the multi-layer structure for the processing chambers. Since a vacuum is not formed in the transfer path 100, the wafers may be vacuum absorbed to the transfer arm thus providing faster wafer transfers, in contrast to the conventional case, wherein the wafers inside the central chamber were merely gravity-supported by the transfer arm, and the wafers had to be moved slowly so as not to fall off the transfer arm.

For those processing chambers requiring a relatively low vacuum state, such as a base oven process, an ashing process, a pre/post etching process, etc., a gate (not shown) is formed toward the transfer path 100 and is selectively opened and closed so as to allow for the passage of wafers.

A vacuum pressure generator 45' is installed inside the processing chamber 45 in order to form a vacuum pressure therein, with the processing chamber 45 carrying out the dry-etching process requiring a high-vacuum to form a plasma.

Therefore, in order to minimize the time or the energy waste necessary to form a high-vacuum state in the processing chamber after being directly exposed to the atmospheric pressure environment, a load lock chamber 43 having a low-vacuum state is connected to one side of the processing chamber 45 and serves as a stand-by region for wafers, and a gate 46, 49 is formed on one side of the load lock chamber 43 facing the transfer path 100.

Each load lock chamber 43 comprises: a transfer arm 54 (FIG. 6) for receiving wafers from the transfer mechanism 52 and transferring them to the processing chamber; an inner transfer device 44 for moving the transfer arm 54; a gate 46, 49 formed on one side of the transfer path 100 which is selectively opened and closed to allow the passage of wafers; and another gate 47, 48, 50, 51 provided on one side of the processing chamber 45 that is selectively opened and closed to allow the passage of wafers between the processing chamber 45 and the load lock chamber 43.

Here, the transfer arm 54 of the load lock chamber 43, and the inner transfer device 44 inside the chamber can be provided in each of the two load lock chambers 43 so as to individually transfer two wafers into the two processing chambers 45 simultaneously.

A vacuum pressure generator 43' may be provided in the load lock chamber 43 so as to form a low-vacuum therein in order to prevent an abrupt vacuum pressure differential inside the processing chamber 45 when the wafers are transferred through the gate 47, 48, 50, 51 between the high vacuum processing chamber 45 and the load lock chamber 43. Such a vacuum pressure generator 43' using a vacuum pump is well-known to those skilled in the art.

In addition, as shown in FIG. 4 and FIG. 5, two processing chambers 45 are placed on both sides, i.e., before and after the load lock chamber 43, respectively, so as to have one load lock chamber 43 in common. In other embodiments, three or more processing chambers 45 may be oriented so as to share one common load lock chamber.

Since the processing chambers 45 are connected to one another through the gates, wafers passing through one specific process are directly moved to another processing chamber, thereby allowing the transfer of wafers between processing chambers.

Figure 6:
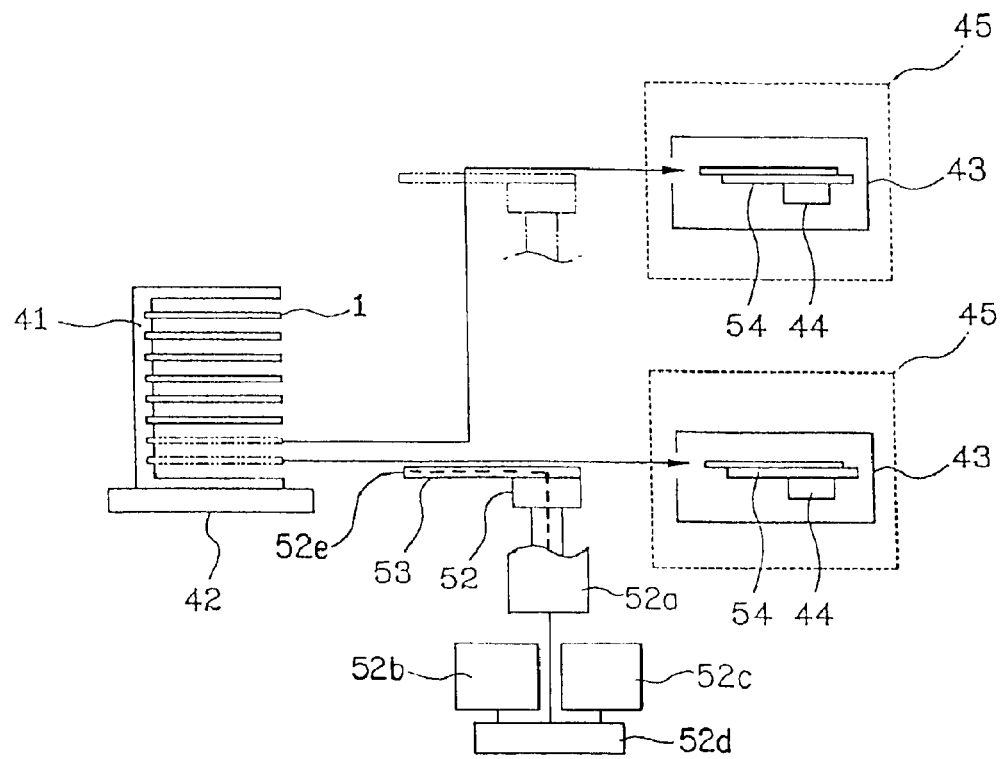
FIG. 6 is a side view schematically showing the transportation state of the wafers of in the multi-chamber system of FIG. 5.

As shown in FIGS. 5 and 6, the transfer mechanism 52 of the present invention installed on the transfer path 100 comprises: a transfer arm 53 for selectively holding the wafers; a transfer robot 52a for loading and unloading wafers to the processing chamber by moving the transfer arm 53; a horizontal driving part 52b for horizontally moving the transfer robot; a vertical driving part 52c for moving the transfer robot up and down; and a controller 52d for applying a control signal to the transfer robot 52a, the horizontal driving part 52b, and the vertical driving part 52c. The transfer arm 53 further includes a vacuum line 52e in order to selectively vacuum-absorb wafers 1 placed thereon. The horizontal and vertical movement is indicated by the arrows in FIGS. 5 and 6.

The transfer arm 53, as shown in FIG. 5, can be constructed such that one wafer is transferred at a time, but can also be constructed as a 4-arm system, wherein four arms are connectably provided in two layers so as to individually transport four wafers at the same time to the load lock chambers. Such a 4-arm system for transferring four wafers individually at a time, or 2-arm system, 3-arm system, etc., which are employed so as to move 2 or 3 wafers at a time, are well-known to those skilled in the art.

Also well-known to those skilled in the art are: the horizontal driving part 52b, which horizontally moves along a rail or guide rod by using a motor or an air cylinder as a driving source, the vertical driving part 52c, which moves up and down along a rail or guide rod; the transfer arm 53 and the transfer robot 52a. Various modifications or alterations of these mechanisms are contemplated within the scope of the present invention.

The multi-chamber system for manufacturing semiconductor devices as shown in FIG. 6 is constructed in such a manner that a cassette 41 having a plurality of wafers 1 stacked therein is mounted on the cassette stage 42, and the horizontal driving part 52b and the vertical driving part 52c of the transfer mechanism 52 are driven on receipt of the control signal from a controller 52d so as to control the movement of the transfer robot 52a toward the wafers 1 inside the cassette 41.

In operation, the transfer mechanism 52 accesses the wafer 1, the transfer robot 52a receives the control signal from the controller 52d, and then makes the transfer arm 53 contact the wafers 1. The transfer arm 53 having the vacuum line 52e vacuum-absorbs the wafers 1 to one side of the transfer arm 53.

When the wafer 1 fixed on the transfer arm 53 is to be moved to a specific processing chamber 45 disposed in the first chamber layer, the wafer 1 is first moved to the load lock chamber 43 connected to the specific chamber 45 in the first chamber layer by the horizontal driving part 52b under control from the controller 52d.

At this time, the gate 46 of the load lock chamber 43 facing the transfer path 100 is opened, and the transfer arm 53 of the transfer mechanism 52 is inserted. Then the vacuum pressure of the vacuum line 52e is shut off, and the wafer 1 is mounted on the transfer arm 54 inside the load lock chamber 43.

The transfer arm 53 of the transfer mechanism 52 exits the load lock chamber 43, and the gate 46 is then closed. Then, the vacuum pressure generator 43' of the load lock chamber 43 is operated so as to place the inside of the load lock chamber 43 into a low vacuum state.

After the load lock chamber 43 reaches a certain low vacuum level, the gate (e.g., gate 47) of the load lock chamber 43 facing the processing chamber 45 is opened, and the inner transfer device 44 of the load lock chamber 43 transfers the wafers mounted on the transfer arm 54 into the processing chamber 45.

While vacuum absorption of the wafer at this stage is difficult because of the low vacuum pressure state in the load lock chamber 43, the small space within the load lock chamber 43 is not as wide as in the conventional one, so that it takes just a short time for the transfer arm 54 to mount the wafers in the processing chamber 45, even at the low speed.

Then the transfer arm 54 exits the processing chamber 45, the gate 47 is closed, and the vacuum pressure generator 45' in the processing chamber 45 is operated, thereby forming a high vacuum inside the processing chamber 45, after which the etching process is carried out.

Meanwhile, if the wafers 1 are to be moved to a specific processing chamber 45 on the second chamber layer, the controller 52d controls both the horizontal driving part 52b and the vertical driving part 52c so as to transfer the wafers 1 to the load lock chamber 43 connected to the specific processing chamber 45 on the second chamber layer.

The wafers 1 are moved up while vacuum absorbed by the transfer arm 53 of the transfer robot 52a, and are inserted into the load lock chamber 43. The subsequent steps are the same as described above for a processing chamber on the first layer.

When the wafers have been transferred and loaded into a plurality of processing chambers 45, corresponding processes are carried out in the respective processing chambers, and the wafers are unloaded in order of process completion. Then, the wafers are transferred to the cassette stage 42 or transferred to a specific processing chamber on a specific layer upon receipt of a control signal from the controller 52d.

When a 4-arm system is installed on the transfer mechanism 52, the transfer mechanism 52 picks up four wafers from the cassette and places two wafers into each of two load lock chambers 43 connected to specific processing chambers. When the inner transfer device 44 and the transfer arm 54 are constructed with a 2-arm system, two wafers are picked up and transferred, one each into two processing chambers. After processing, two or one wafer is transferred from the processing chamber to the transfer mechanism 52 so as to carry out a post-process step.

Figure 7:
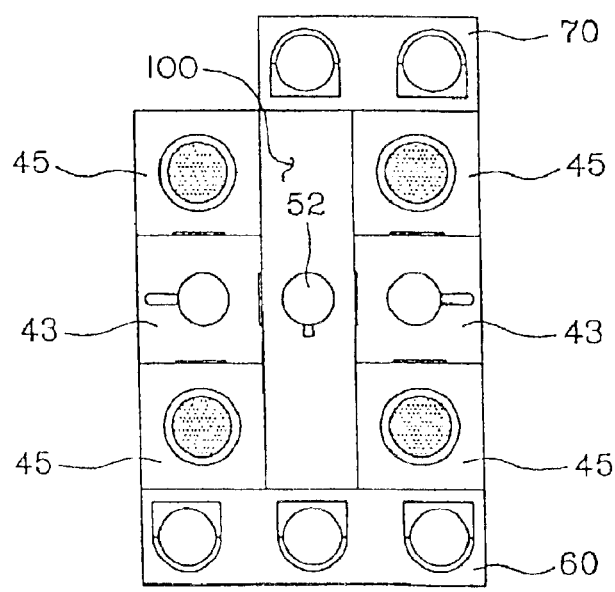
FIG. 7 is a plan view showing a multi-chamber system of an etching facility for manufacturing semiconductor devices according to a second embodiment of the present invention.

In another aspect of the present invention as shown in FIG. 7, a multi-chamber system of an etching facility for manufacturing semiconductor devices comprises: a first cassette stage 60 for mounting a cassette containing unprocessed wafers; a second cassette stage 70 for mounting a cassette containing processed wafers; a plurality of processing chambers 45 aligned on both sides of a rectangular-shaped transfer path 100, the processing chambers being arranged in parallel in a multi-layered path for wafers, and for carrying out processing of wafers; and a transfer mechanism 52 installed in the path allowing for vertical/horizontal reciprocal movement, and including a transfer robot for transferring wafers mounted on the first cassette stage 60 to the plurality of processing chambers 45, and for transferring wafers into the second cassette stage 70 after processing.

Figure 8:
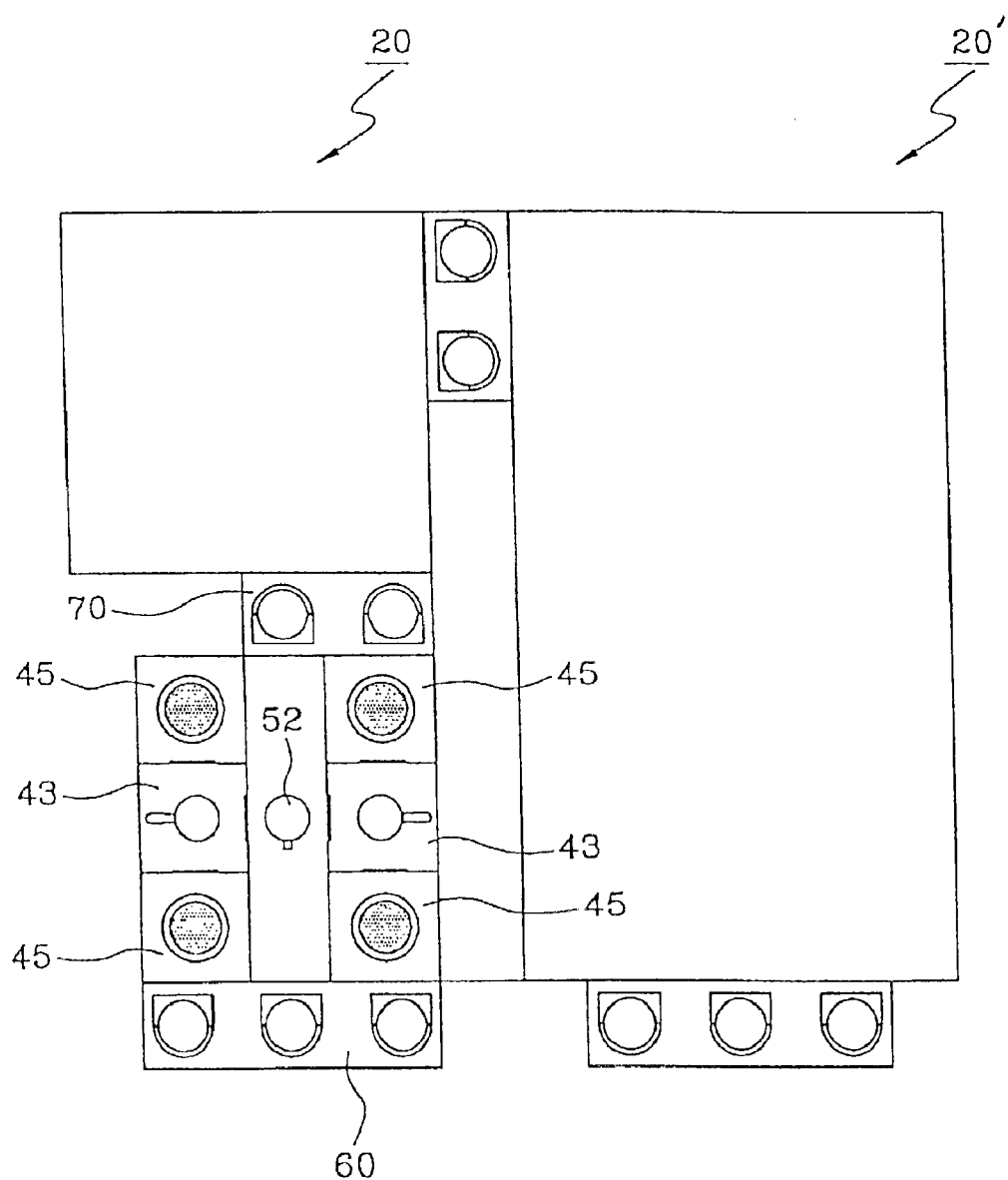
FIG. 8 is a plan view of the multi-chamber system of FIG. 7 installed inside a semiconductor device fabrication line.

This embodiment is constructed such that the wafers passing through all of the processing detailed above in the description of the first embodiment are stacked on the second cassette stage 70, and such that the multi-chamber system is easily connected to other processing facilities 20 as shown in FIG. 8.

Referring to FIG. 8, wafers are supplied into the multi-chamber system through the first cassette stage 60 installed in the front of the facility, and pass through a plurality of processes in the plurality of processing chambers 45, and are stacked on the second cassette stage 70 on the back side of the facility. Then, wafers are moved to another facility 20 by an automatic transfer part of the other facility 20, pass through processing therein, are transferred into the side of a second facility 20', pass through that facility 20', and are stacked on the cassette stage of the second facility 20' on the right side of the multi-chamber system.

Therefore, unlike the conventional case, wherein all cassette stages are provided on the front sides of the facility, therefore requiring a supplementary cassette transfer car in order to transport the cassette between facilities, the necessity for a supplementary cassette transfer car for transporting cassettes between facilities is reduced according to the present invention.

Figure 9:
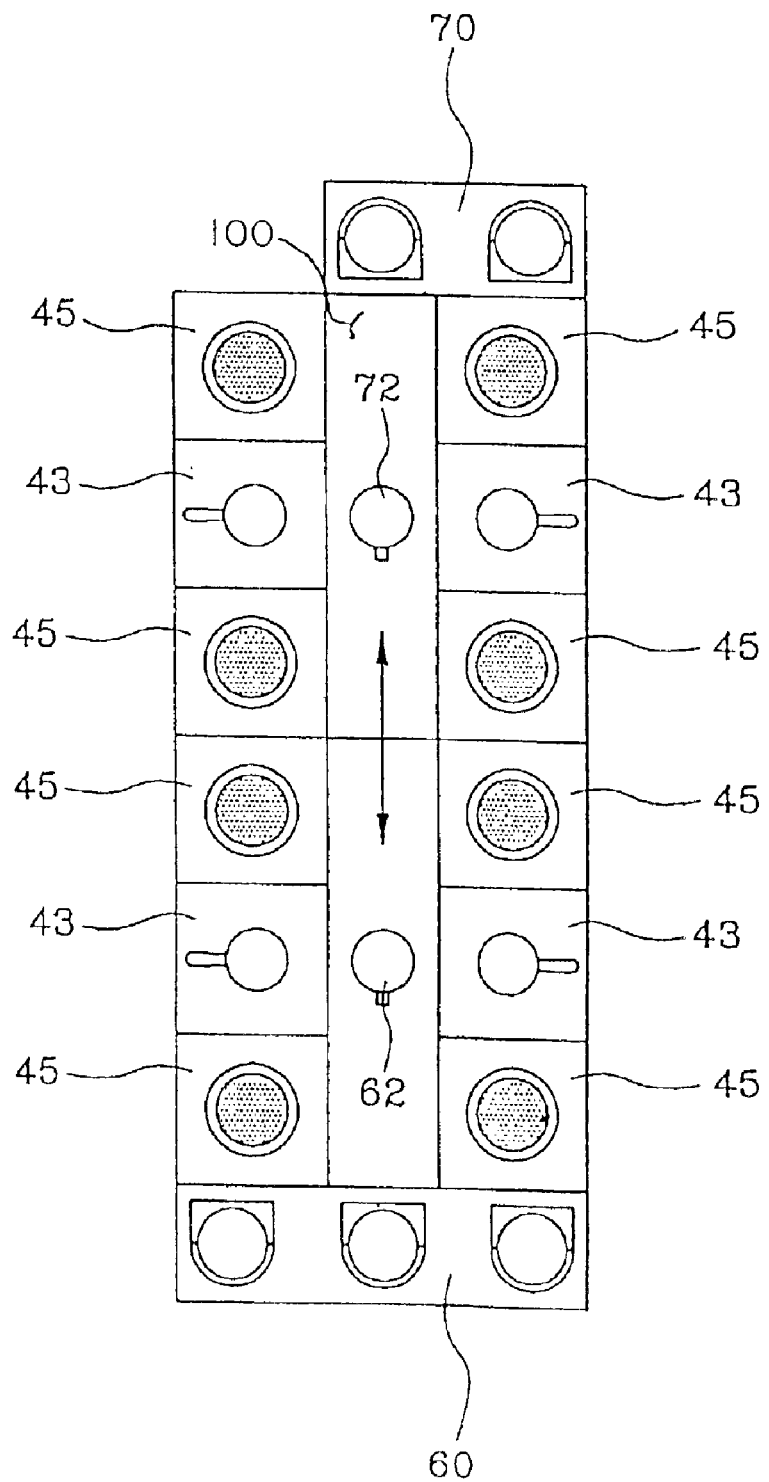
FIG. 9 is a plan view of an extended version of the embodiment of the present invention shown in FIG. 7.

In addition, as shown in FIG. 9, the number of processing chambers 45 can be increased, and the transfer path 100 extended, so that more processing chambers 45 and load lock chambers 43 are aligned on both sides of the transfer path 100.

When the length of the transfer path 100 is extended, a first transfer mechanism 62 and a second transfer mechanism 72 can be installed, wherein the transfer from one to the other is possible.

Therefore, unlike the conventional multi-chamber system, the number of processing chambers can be increased without changing the width of the facility. However, there are limitations in the length of the facility and the facility control, etc.

Figure 10:
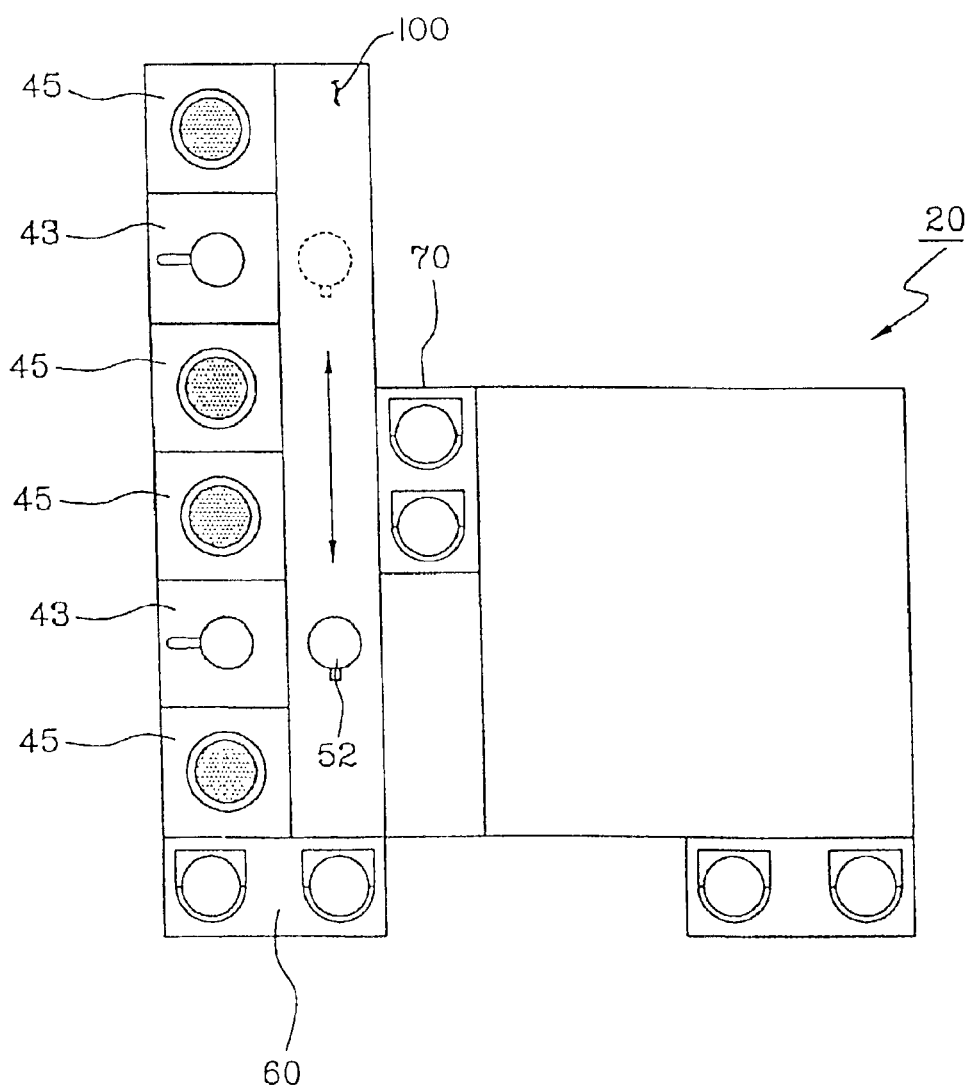
FIG. 10 is a plan view of a third embodiment of the multi-chamber system of an etching facility for manufacturing semiconductor devices of the present invention installed inside a semiconductor device fabrication line.

According to a third embodiment of the present invention, as shown in FIG. 10, a multi-chamber system of an etching facility for manufacturing semiconductor devices comprises: a cassette stage 42 for mounting a cassette having wafers stacked thereon; a plurality of processing chambers 45 aligned along one side of a transfer path 100, the processing chambers being arranged in multi-layers for carrying out wafer processing; and a transfer mechanism 52 provided in the transfer path 100 for loading and unloading wafers into the plurality of processing chambers using vertical and horizontal movement. The processing chambers 45 and the load lock chambers 43, which are stand-by areas for wafers, are aligned on only one side of the transfer path 100.

As above, each load lock chamber 43 comprises: a transfer arm for transferring wafers from the transfer mechanism 52 to the processing chamber; an inner transfer device for transferring the transfer arm; a gate confronting the transfer path and another gate confronting the processing chamber, which are selectively opened and closed to allow passage of the wafers.

The transfer mechanism 52 of the third embodiment of the present invention, unlike the first and the second embodiments of the present invention, loads the wafers on the first cassette stage 60 in only one direction after horizontally-rotating 90 degrees while vacuum-absorbing the wafers, because the processing chambers 45 and the load lock chambers 43 are aligned along only one side.

The transfer mechanism 52 transports unprocessed wafers stacked on the cassette mounted on the first cassette stage 60 to the processing chamber 45, and after processing, transports the wafers from the processing chamber to the second cassette stage 70, which is located for easy transfer to subsequent processes.

That is, as shown in FIG. 10, the second cassette stage 70 is displaced on the opposite side of the transfer path from the processing chambers 45 and the load lock chambers 43, so that the wafers after one process are easily transported to subsequent processes.

Therefore, according to the third embodiment of the present invention, the efficiency of space usage is increased by applying the multi-chamber system of the present invention to the rest of the space in the cleanroom after installing various facilities with various shapes and volumes.

Accordingly, in the multi-chamber system of an etching facility for manufacturing semiconductor devices, a plurality of processing chambers are aligned in parallel and with multi-layers, thereby greatly reducing the space, width and volume of the facility. Further, the expenses for the facilities and installation can be minimized by reducing the space requiring a vacuum state, and the connection with other processing facilities is easy, such that the efficiency of space usage is improved thereby increasing the transportation speed of wafers.

In the accompanying drawings and specification, there have been disclosed typical preferred embodiments of the invention and, although specific terms are employed, they are used in a generic and descriptive sense only and not for purposes of limitation, the scope of the invention being set forth in the following claims.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A method of manufacturing semiconductor devices in a multi-chamber system of an etching facility, comprising:
   mounting on a cassette stage a cassette that has wafers stacked thereon;
   providing a plurality of processing chambers;
   providing at least one load lock chamber through which wafers are passed directly into and out of the processing chambers;
   maintaining a horizontal transfer path that is adjacent to the cassette stage at atmospheric pressure, the transfer path being aligned in parallel with a direction along which all of the processing chambers are aligned and providing space for transportation of wafers: and
   loading and unloading the wafers stacked on the cassette stage to and from the plurality of processing chambers using a transfer mechanism installed in the transfer path.

2. The method of manufacturing semiconductor devices according to claim 1, wherein said providing comprises installing the processing chambers in multiple layers.

3. The method of manufacturing semiconductor devices according to claim 1, wherein each processing chamber has a gate formed on a side away from the transfer path, said loading and unloading comprises selectively opening and closing a corresponding gate to allow passage of wafers to a processing chamber.

4. The method of manufacturing semiconductor devices according to claim 1, further comprising:

transferring wafers from the transfer mechanism to the processing chambers using a transfer arm disposed in the load lock chamber, the load lock chamber including an inner transfer device for moving the transfer arm and gates respectively formed on a side of the transfer path and a side of the processing chambers, the method further comprising selectively opening and closing the gates to allow passage of the wafers.

5. The method of manufacturing semiconductor devices according to claim 4, wherein the transfer arm includes a plurality of transfer arms, said transferring comprising transferring a plurality of wafers using the plurality of transfer arms.

6. The method of manufacturing semiconductor devices according to claim 1, further comprising maintaining the load lock chamber at a vacuum pressure.

7. The method of manufacturing semiconductor devices according to claim 1, wherein said providing at least one load lock chamber comprises providing one common load lock chamber for the plurality of processing chambers.

8. The method of manufacturing semiconductor devices according to claim 1, wherein the processing chambers are connected by gates, the method further comprising directly moving wafers after a process in one processing chamber to another processing chamber for a subsequent process.

9. The method of manufacturing semiconductor devices according to claim 1, further comprising maintaining the processing chambers at a vacuum pressure.

10. The method of manufacturing semiconductor devices according to claim 1, wherein said loading and unloading comprises:

selectively holding the wafers on a transfer arm; and loading and unloading the wafers into the processing chambers by moving the transfer arm, the transfer arm being moved horizontally by a transfer robot in accordance with control signals applied to the transfer robot.

11. The method of manufacturing semiconductor devices according to claim 10, wherein said loading and unloading further comprises moving the transfer robot vertically in accordance with the control signals.

12. The method of manufacturing semiconductor devices according to claim 10, wherein said loading and unloading comprises vacuum-absorbing the wafers to the transfer arm using a vacuum line.

13. The method of manufacturing semiconductor devices according to claim 10, wherein the transfer arm includes a plurality of transfer arms, said loading and unloading comprises simultaneously transferring a plurality of wafers using the plurality of transfer arms.

14. The method of manufacturing semiconductor devices according to claim 10, wherein said loading and unloading comprises moving the transfer arm horizontally using a motor or a pneumatic cylinder.

15. The method of manufacturing semiconductor devices according to claim 10, wherein said loading and unloading comprising moving the transfer arm vertically using a motor or a pneumatic cylinder.

16. The method of manufacturing semiconductor devices according to claim 1, wherein the transfer path has extended length and includes a plurality of the transfer mechanisms, said loading and unloading comprises transferring the wafers from one transfer mechanism to another transfer mechanism.

17. The method of manufacturing semiconductor devices according to claim 1, wherein said loading and unloading comprises transferring unprocessed wafers from a cassette mounted on a first cassette stage to one of the processing chambers and transferring processed wafers from another of the processing chambers to a second cassette stage which is located such that the wafers are easily transferred to a subsequent process.

18. The method of manufacturing semiconductor devices of claim 1, wherein the transfer path has a rectangular shape.

19. A method of manufacturing semiconductor devices in a multi-chamber system of an etching facility, comprising:

mounting on a cassette stage a cassette that has wafers stacked thereon;

providing a plurality of processing chambers aligned in a plurality of layers;

providing at least one load lock chamber through which wafers are passed directly into and out of the processing chambers;

maintaining a horizontal transfer path that is adjacent to the cassette stage at atmospheric pressure, the transfer path being aligned in parallel with a direction along which the processing chambers are aligned and providing space for transportation of wafers and having a width slightly larger than a diameter of the wafers; and loading and unloading the wafers stacked on the cassette stage to and from the plurality of processing chambers with vertical/horizontal reciprocal movement using a transfer mechanism installed in the transfer path.

20. The method of manufacturing semiconductor devices according to claim 19, wherein the transfer path has a rectangular shape.

21. The method of manufacturing semiconductor devices according to claim 19, wherein said providing comprises providing the processing chambers in a plurality of layers comprising 2 to 5 layers.

22. The method of claim 21, further comprising maintaining the processing chambers at a vacuum pressure.

23. The method of manufacturing semiconductor devices according to claim 19, further comprising:

transferring wafers from the transfer mechanism to the processing chambers using a transfer arm disposed in the load lock chamber, the load lock chamber including an inner transfer device for moving the transfer arm and gates respectively formed on a side of the transfer path and a side of the processing chambers, the method further comprising selectively opening and closing the gates to allow passage of the wafers.

24. The method of manufacturing semiconductor devices according to claim 23, wherein the transfer arm includes a plurality of transfer arms, said transferring comprising simultaneously transferring a plurality of wafers using the plurality of transfer arms.

25. The method of manufacturing semiconductor devices according to claim 19, wherein the transfer mechanism includes a transfer arm, said loading and unloading comprising:

selectively vacuum-absorbing the wafers to the transfer arm using a vacuum line; and loading and unloading the wafers into the processing chambers by moving the transfer arm, the transfer arm being moved horizontally and vertically by a transfer robot in accordance with control signals applied to the transfer robot.

26. The method of manufacturing semiconductor devices according to claim 25, the transfer arm comprises a plurality of the transfer arms, said loading and unloading comprising simultaneously transferring a plurality of wafers using the plurality of transfer arms.

27. The method of manufacturing semiconductor devices according to claim 25, wherein said loading and unloading comprises moving the transfer arm vertically and horizontally using a motor or a pneumatic cylinder.

28. The method of manufacturing semiconductor devices according to claim 19, wherein the transfer path has extended length and includes a plurality of transfer mechanisms, said loading and unloading comprising transferring the wafers from one transfer mechanism to another transfer mechanism.

29. The method of manufacturing semiconductor devices according to claim 19, wherein said loading and unloading comprises transferring unprocessed wafers from a cassette mounted on a first cassette stage to one of the processing chambers and transferring processed wafers from another of the processing chambers to a second cassette stage which is located such that the wafers are easily transferred to a subsequent process.

30. The method of manufacturing semiconductor devices according to claim 19, wherein said providing comprises providing to processing chambers arranged in multi-layers, the method further comprising mounting on an additional cassette stage a cassette that has processed wafers stacked thereon.

31. A method of manufacturing semiconductor devices in a multi-chamber system of an etching facility, comprising:
mounting on a cassette stage a cassette that has wafers stacked thereon;
maintaining a horizontal transfer path without a vacuum, the transfer path being provided as adjacent to the cassette stage and as providing space for transportation of wafers;
providing a plurality of processing chambers aligned along a direction in parallel with the transfer path;
providing at least one load lock chamber through which wafers are passed directly into and out of the processing chambers: and
loading and unloading the wafers stacked on the cassette stage to and from the plurality of processing chambers using a transfer mechanism in the multi-chamber system.

32. The method of manufacturing semiconductor devices according to claim 31, further comprising maintaining the load lock chamber at vacuum pressure.

33. The method of manufacturing semiconductor devices according to claim 31, further comprising maintaining the processing chambers at vacuum pressure.

34. The method of manufacturing semiconductor devices according to claim 31, wherein said loading and unloading comprises transferring the wafers by vacuum-absorbing the wafers to a transfer arm using a vacuum line.

35. A method of manufacturing semiconductor devices in a multi-chamber system, comprising:
mounting a cassette having a plurality of substrates stacked therein on a cassette stage;
loading a first substrate from the cassette to a load lock chamber by a transfer mechanism through a horizontal transfer path, the transfer path providing a space for transportation of the first substrate at atmospheric pressure between the cassette stage and the load lock chamber; and
loading the first substrate from the load lock chamber directly into a first processing chamber among a plurality of processing chambers aligned along a direction in parallel with the transfer path.

36. The method of manufacturing semiconductor devices according to claim 35, wherein the transfer path has a rectangular shape.

37. The method of manufacturing semiconductor devices according to claim 35, wherein the load lock chamber is connected to one side of the first processing chamber.

38. The method of manufacturing semiconductor devices according to claim 37, wherein the load lock chamber is maintained at a vacuum pressure.

39. The method of manufacturing semiconductor devices according to claim 35, wherein the load lock chamber is located at a first side of the transfer path, and the cassette stage is located at a second side of the transfer path, the first side of the transfer path being opposite to the second side of the transfer path.

40. The method of manufacturing semiconductor devices according to claim 39, wherein a plurality of load lock chambers are disposed in parallel with the transfer path.

41. The method of manufacturing semiconductor devices according to claim 40, wherein the first processing chamber and the a second processing chamber are formed with a multi-layer structure.

42. The method of manufacturing semiconductor devices according to claim 35, further comprising a) loading a second substrate from the cassette to the load lock chamber by the transfer mechanism through the transfer path, the transfer path providing a space for transportation of the second substrate at atmospheric pressure between the cassette and the load lock chamber, and b) loading the second substrate from the load lock chamber into a second processing chamber, the load lock chamber being connected to one side of the first processing chamber.

43. The method of manufacturing semiconductor devices according to claim 35, further comprising loading a second substrate from the cassette to an area next to the first substrate by the transfer mechanism through the transfer path, the transfer path providing a space for transportation of the second substrate at atmospheric pressure between the cassette and the load lock chamber, the first and second substrates being aligned to the transfer path in parallel.

44. The method of claim 35, further comprising maintaining the processing chambers at a vacuum pressure.

* * * * *

(12) EX PARTE REEXAMINATION CERTIFICATE (9084th)
United States Patent
Kim et al.

(10) Number: US 6,930,050 C1
(45) Certificate Issued: Jun. 19, 2012

(54) MULTI-CHAMBER SYSTEM HAVING COMPACT INSTALLATION SET-UP FOR AN ETCHING FACILITY FOR SEMICONDUCTOR DEVICE MANUFACTURING

(75) Inventors: Ki-sang Kim, Kyungki-do (KR);
Gyu-chan Jeoung, Kyungki-do (KR);
Gyu-hwan Kwag, Kyungki-do (KR)

(73) Assignee: Samsung Electronics Co., Ltd., Maetan-Dong, Paldal-Gu, Suwon, Kyungki-Do (KR)

Reexamination Request:
No. 90/011,174, Aug. 23, 2010

Reexamination Certificate for:
Patent No.: 6,930,050
Issued: Aug. 16, 2005
Appl. No.: 10/298,605
Filed: Nov. 19, 2002

Related U.S. Application Data

(62) Division of application No. 09/237,229, filed on Jan. 26, 1999, now Pat. No. 6,503,365.

(30) Foreign Application Priority Data

Apr. 21, 1998 (KR) .......................................... 98-14228

(51) Int. Cl.
*C23C 16/00* (2006.01)
*B65G 49/07* (2006.01)
*B65H 1/00* (2006.01)
*H01H 21/30* (2006.01)
*H01L 21/461* (2006.01)

(52) U.S. Cl. ................... 438/716; 118/719; 156/345.31; 156/345.32; 414/217; 414/222.01; 414/222.07; 414/222.12; 414/800; 414/804; 414/805; 414/806; 414/807; 414/808; 414/810; 414/814; 414/935; 414/937; 414/939; 414/941; 438/639

(58) Field of Classification Search ................... 156/160
See application file for complete search history.

(56) References Cited

To view the complete listing of prior art documents cited during the proceeding for Reexamination Control Number 90/011,174, please refer to the USPTO's public Patent Application Information Retrieval (PAIR) system under the Display References tab.

*Primary Examiner* — Timothy J. Kugel

(57) ABSTRACT

A multi-chamber system of an etching facility for manufacturing semiconductor devices occupies a minimum amount of floor space in a cleanroom by installing a plurality of processing chambers in multi-layers and in parallel along a transfer path situated between the processing chambers. The multi-layers number 2 to 5, and the transfer path can be rectangular in shape and need only be slightly wider than the diameter of a wafer. The total width of the multi-chamber system is the sum of the width of one processing chamber plus the width of the transfer path.

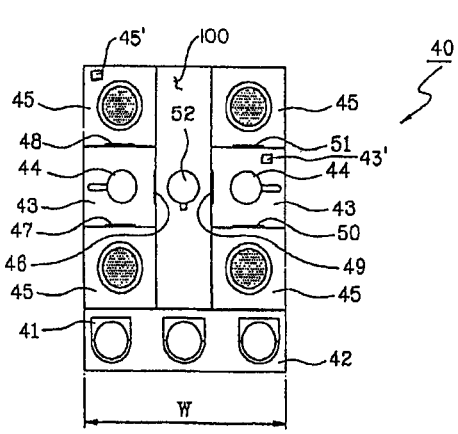

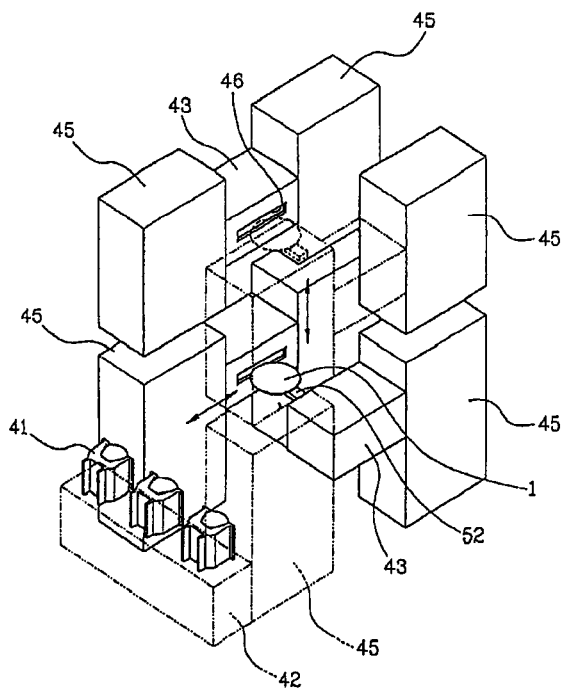

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 7, 19, 31, 35, 41 and 42 are determined to be patentable as amended.

Claims 2-6, 8-18, 20-30, 32-34, 36-40, 43 and 44, dependent on an amended claim, are determined to be patentable.

1. A method of manufacturing semiconductor devices in a multi-chamber system of an etching facility, comprising: mounting on a cassette stage a cassette that has wafers stacked thereon; providing a plurality of etch processing chambers; providing at least one load lock chamber [through which] *which are each configured to pass* wafers [are passed] *both* directly into and out of the processing chambers *and which are each further configured to receive the wafers from a horizontal transfer path that is adjacent the cassette stage*; maintaining [a] *the* horizontal transfer path [that is adjacent to the cassette stage] at atmospheric pressure, the transfer path being aligned in parallel with a direction along which all of the processing chambers are aligned and providing space for transportation of wafers; and loading and unloading the wafers stacked on the cassette stage to and from the plurality of processing chambers using a transfer [mechanism] *robot* installed in the transfer path *to load and unload wafers into and from the at least one load lock*.

7. The method of manufacturing semiconductor devices according to claim 1, wherein said providing at least one load lock chamber comprises providing one common load lock chamber [for the plurality of] *operatively connected to two* processing chambers *located on opposite sides of the one load lock chamber*.

19. A method of manufacturing semiconductor devices in a multi-chamber system of an etching facility, comprising: mounting on a cassette stage a cassette that has wafers stacked thereon; providing a plurality of processing chambers aligned in a plurality of layers; providing at least one load lock chamber[through which], *each load lock chamber for passing* wafers [are passed] directly into and out of the processing chambers; maintaining a horizontal transfer path that is adjacent to the cassette stage at atmospheric pressure, the transfer path being aligned in parallel with a direction along which the processing chambers are aligned and providing space for transportation of wafers and having a width slightly larger than a diameter of the wafers; and loading and unloading the wafers stacked on the cassette stage *via the at least one load lock chamber* to and from the plurality of processing chambers with vertical/horizontal reciprocal movement using a transfer mechanism installed in the transfer path.

31. A method of manufacturing semiconductor devices in a multi-chamber system of an etching facility, comprising:
    mounting on a cassette stage a cassette that has wafers stacked thereon;
    maintaining a horizontal transfer path without a vacuum, the transfer path being provided as adjacent to the cassette stage and as providing space for transportation of wafers;
    providing a plurality of etch processing chambers aligned along a direction in parallel with the transfer path;
    providing at least one load lock chamber through *each of* which wafers are passed *both* directly into and out of the processing chambers: and
    loading and unloading the wafers stacked on the cassette stage to and from the plurality of processing chambers using a transfer mechanism *located* in the [multi-chamber system] *horizontal transfer path to load and unload wafers into and from the at least one load lock chamber*.

35. A method of manufacturing semiconductor devices in a multi-chamber system, comprising: mounting a cassette having a plurality of substrates stacked therein on a cassette stage; loading a first substrate from the cassette [to] *into* a load lock chamber [by] *using* a transfer mechanism through a horizontal transfer path, *the transfer mechanism located in the transfer path, and* the transfer path providing a space for transportation of the first substrate at atmospheric pressure between the cassette stage and the load lock chamber; [and] loading the first substrate from the load lock chamber directly into a first etch processing chamber among a plurality of processing chambers aligned along a direction in parallel with the transfer path; *and unloading the first substrate from the first etch processing chamber directly into the load lock chamber*.

41. The method of manufacturing semiconductor devices according to claim 40, wherein the first processing chamber and [the] *a* second processing chamber are formed with a multi-layer structure.

42. [The method of manufacturing semiconductor devices according to claim 35.] *A method of manufacturing semiconductor devices in a multi-chamber system, comprising: mounting a cassette having a plurality of substrates stacked therein on a cassette stage; loading a first substrate from the cassette to a load lock chamber by a transfer mechanism through a horizontal transfer path, the transfer path providing a space for transportation of the first substrate at atmospheric pressure between the cassette stage and the load lock chamber; and loading the first substrate from the load lock chamber directly into a first processing chamber among a plurality of processing chambers aligned along a direction in parallel with the transfer path, and*
    further comprising a) loading a second substrate from the cassette to the load lock chamber by the transfer mechanism through the transfer path, the transfer path providing a space for transportation of the second substrate at atmospheric pressure between the cassette and the load lock chamber, and b) loading the second substrate from the load lock chamber into a second processing chamber, the load lock chamber being connected to one side of the first processing chamber.

\* \* \* \* \*